United States Patent [19]

Kataoka et al.

[11] Patent Number: 5,204,553
[45] Date of Patent: Apr. 20, 1993

[54] FIELD EFFECT TRANSISTOR CIRCUIT

[75] Inventors: Shigeru Kataoka, Kawasaki; Shoichi Shimizu, Fujisawa, both of Japan

[73] Assignee: Kabushiki Kaisha Toshiba, Kawasaki, Japan

[21] Appl. No.: 728,530

[22] Filed: Jul. 11, 1991

[30] Foreign Application Priority Data

Jul. 13, 1990 [JP] Japan ................... 2-184012

[51] Int. Cl.⁵ ............... H03K 17/00; H03K 17/687; H03K 19/003; H03K 19/0185
[52] U.S. Cl. .................................. 307/443; 307/475
[58] Field of Search ............... 307/443, 446, 448, 450, 307/475

[56] References Cited

U.S. PATENT DOCUMENTS 4,680,488  7/1987  Okumura et al. ............... 307/448 X
4,724,342  2/1988  Sato et al. ........................ 307/448 X Primary Examiner—David Mis
Attorney, Agent, or Firm—Finnegan, Henderson, Farabow, Garrett & Dunner

[57] ABSTRACT

An output signal from an inverter is supplied to a push-pull buffer circuit which includes a first GaAs FET for charging an output terminal to a high potential, a second GaAs FET for discharging the output terminal to a low potential, and a current limiting element connected in series to the first GaAs FET, for charging the output terminal to a high potential.

11 Claims, 5 Drawing Sheets

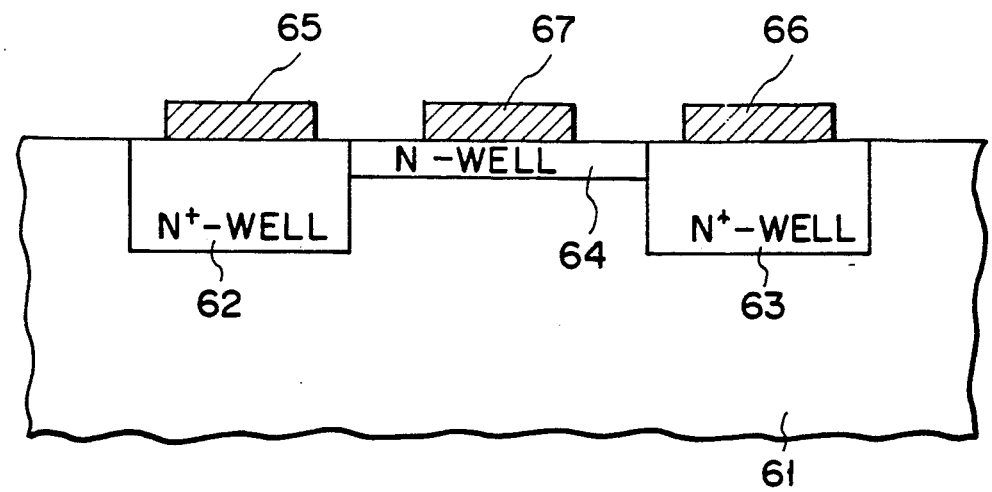
F I G. 5
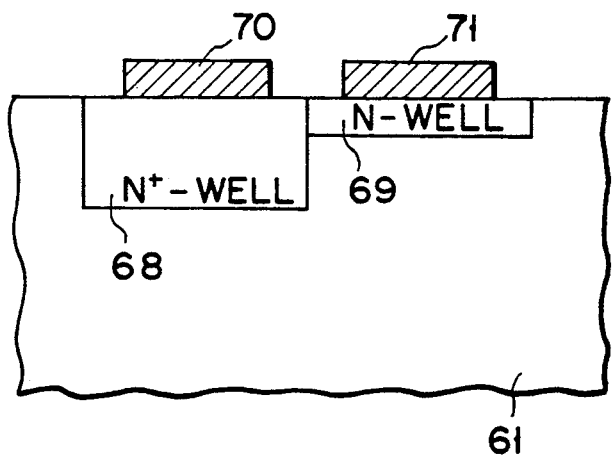
F I G. 6
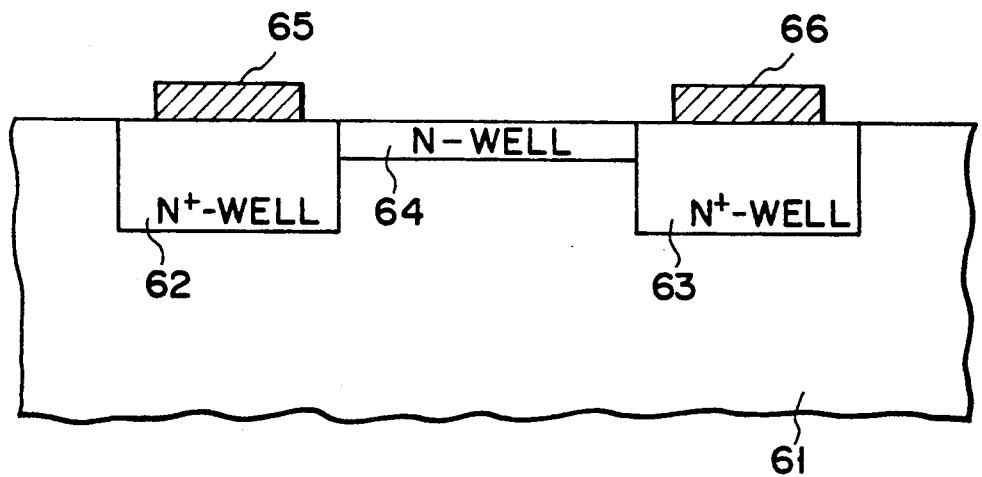
F I G. 8

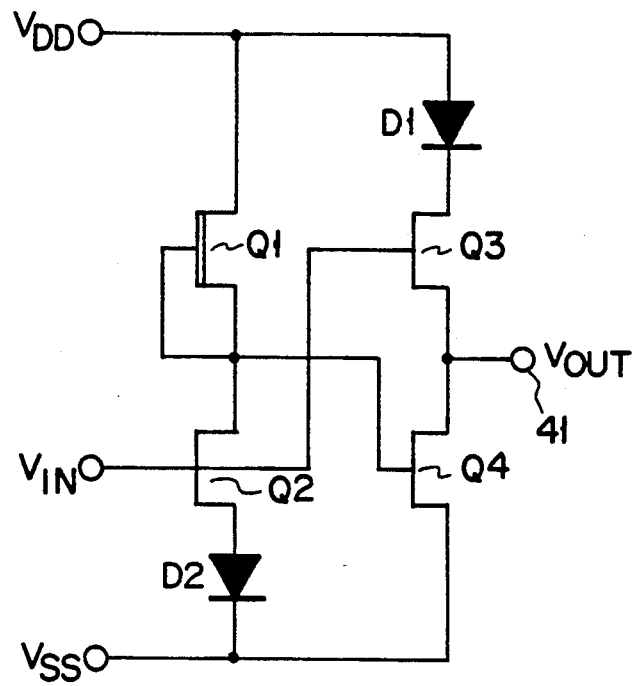
F I G. 10
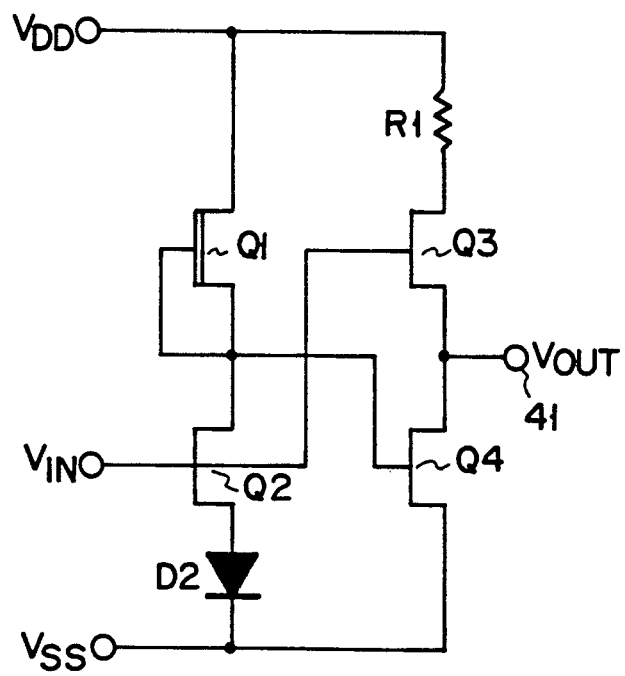
F I G. 11

FIELD EFFECT TRANSISTOR CIRCUIT

BACKGROUND OF THE INVENTION

1. Field of the Invention

The present invention relates to an integrated circuit including GaAs FETs (Field Effect Transistors), more particularly to an interface circuit in a DCFL (Direct Coupled FET Logic) circuit.

2. Description of the Related Art

Of late, the high responsiveness and low power consumption of logic circuits employing GaAs-MESFETs have received the attention of practitioners and been gradually developed. However, as is well known in the art, a logic circuit employing GaAs-MESFETs is inferior, in terms of a capacity for driving a load circuit, to a logic circuit such as an ECL (Emitter Coupled Logic) circuit employing silicon bipolar elements. Taking this into consideration, a buffer circuit is additionally used to improve the capacity for driving a load circuit when the input capacitance of the load circuit is low.

For example, in a conventional integrated circuit employing a DCFL circuit, a push-pull buffer circuit 20 which includes GaAs-MESFETs Q3 and Q4 is connected to an inverter 10 including GaAs-MESFETs Q1 and Q2, as shown in FIG. 1. In this drawing, GaAs-MESFETs Q5 and Q6 form a part of an inverter 30 which serves as the input section of another integrated circuit.

In the conventional integrated circuit shown in FIG. 1, the FETs Q2 and Q4 are turned off when an input signal VIN, which is supplied to the gate of the FET Q2, changes to a low level. As a result of the turning off of the FETs Q2 and Q4, the voltage applied to the gate of the FET Q3 rises almost to the level of a power source potential VDD, turning the FET Q3 on, such that an output signal VOUT changes to a high level. Then, the level of this signal VOUT falls to the Schottky potential (0.6 to 0.7 V) of the FET Q5 included in the inverter 30 serving as the input section of another integrated circuit. In this condition, the voltage VGS between the gate and source of the FET Q3 is high enough to produce a large amount of drain current ID which flows into the FET Q3. This current ID is expressed by the following equation 1:

$$ID = K(VGS - VTH)^2 \quad 1)$$

(where K is a constant, and VTH is the threshold voltage of the FET Q3.)

The drain current ID passing through the FET Q3 flows to the source of the FET Q5 via the gate and Schottky junction thereof. Due to such a drain current, low power consumption, which is one of the features of a logic circuit employing GaAs-MESFETs, is lost.

SUMMARY OF THE INVENTION

It is accordingly the object of the present invention to provide a low-power-consumption field effect transistor circuit employing GaAs-MESFETs and having a large capacity for driving a load circuit.

According to this invention, the field effect transistor circuit comprises a signal inverting circuit to which an input signal is supplied; first and second potential sources; an output terminal for outputting a signal; a current limiting element, one end of which is connected to the first potential source; a first field effect transistor having a drain connected to the other end of the current limiting circuit, a source connected to the output terminal, and a gate receiving one of the input signal and an output signal supplied from the signal inverting circuit; and a second field effect transistor having a drain connected to the output terminal, a source connected to the second potential source, and a gate receiving the other of the input signal and the output signal supplied from the signal inverting circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a diagram showing in cross section the structure of each of the field effect transistors included in the circuit shown in FIG. 4;

FIG. 6 is a diagram showing in cross section the structure of the diode used in the first embodiment;

FIG. 8 is a diagram showing in cross section the structure of the resistor included in the circuit shown in FIG. 7

FIG. 10 is a diagram showing a circuit configuration wherein a diode is used as the current limiting element of the second embodiment; and FIG. 11 is a diagram showing a circuit configuration wherein a resistor is used as the current limiting element of the second embodiment.

DETAILED DESCRIPTION OF THE PREFERRED EMBODIMENTS

Preferred embodiments of the present invention will now be described in detail with reference to the accompanying drawings.

Figure 1:
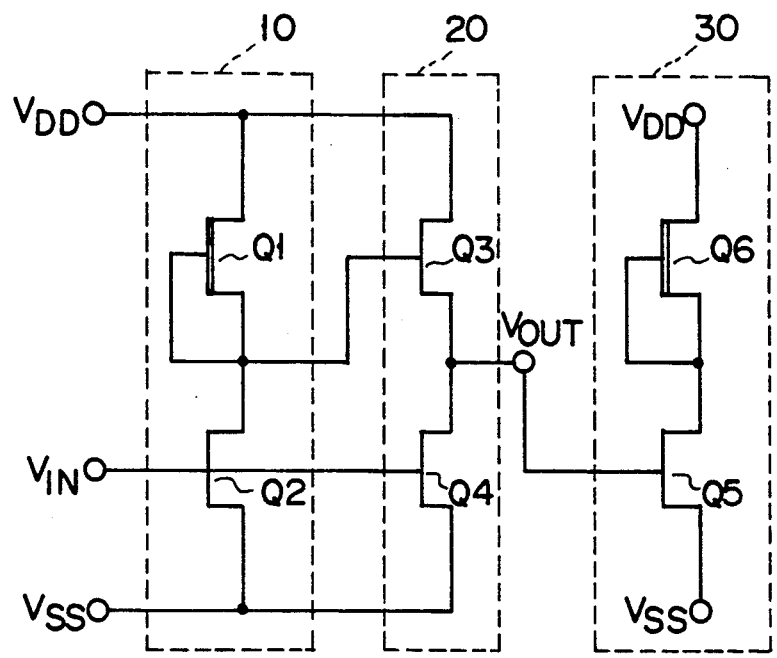
FIG. 1 is a diagram showing the configuration of a conventional inverter circuit.
Figure 2:
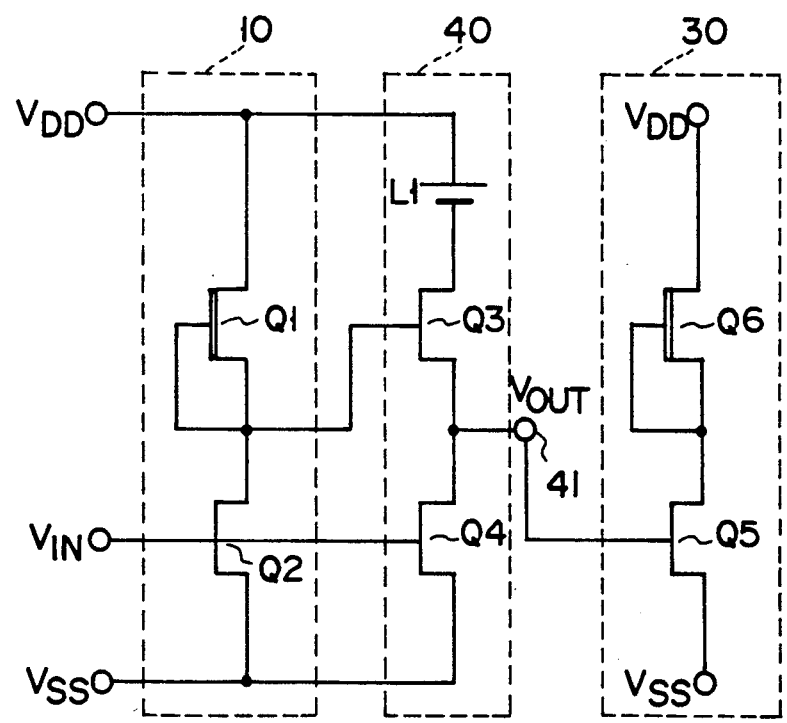
FIG. 2 is a diagram illustrating the configuration of an inverter circuit according to a first embodiment of the present invention.

FIG. 2 shows an inverter circuit according to the first embodiment of the present invention. This inverter circuit is provided on the output interface of an integrated circuit comprising a DCFL circuit, and includes an inverter 10 for inverting a signal generated in the integrated circuit and a push-pull buffer circuit 40 arranged on the output side of the inverter 10. Reference numeral 30 denotes an inverter which serves as the input section of another integrated circuit.

GaAs-MESFETs Q1 and Q2 are provided in the inverter 10 as in a conventional inverter circuit. The FET Q1 is a depletion type FET having a negative threshold voltage. The drain of the FET Q1 is connected to a power source for applying a voltage VDD of e.g. +1.5V, and the source and gate of the FET Q1 are connected to each other. On the other hand, the FET Q2 is an enhancement type FET having a positive threshold voltage. The drain of the FET Q2 is connected to the node at which the source and gate of the FET Q1 are connected to each other, and the source of the FET Q2 is connected to a power source for applying a voltage VSS of e.g. 0 V. An input signal VIN is supplied to the gate of the FET Q2.

GaAs-MESFETs Q3 and Q4 and a current limiting element L1 are provided in the buffer circuit 40. The FET Q3 is also an enhancement type FET. The source and gate of this FET Q3 are respectively connected to an output terminal 41 and the node at which the source and gate of the FET Q1, arranged in the inverter 10, are connected to each other. Similarly, the FET Q4 is also an enhancement type FET. The drain and source of this FET Q4 are respectively connected to the output terminal 41 and the power source for applying the voltage VSS. The input signal VIN is supplied to the gate of the FET Q4. Further, one end of the current limiting element L1 is connected to the power source for applying the voltage VDD, and the other end is connected to the drain of the FET Q3. In addition, the channel width of each of the FETs employed in the buffer circuit 40 is set to be greater than the channel width of each of the FETs included in the inverter 10; in other words, the channel width of each of the FETs in the inverter 10 is set to be less than the channel width of each of the FETs in the buffer circuit 40.

Moreover, GaAs-MESFETs Q5 and Q6 are provided in the inverter 30 as in a conventional inverter circuit. The FET Q5 is of an enhancement type, and the FET Q6 is of a depletion type.

In the circuit of the first embodiment, the current limiting element L1 is provided between the power source for applying the voltage VDD and the drain of the FET Q3, unlike in a conventional circuit. This current limiting element L1 prevents an excess current from flowing into the FET Q3.

To be specific, when the input signal VIN changes to a low level, the FETs Q2 and Q4 are turned off, with the result that the gate potential of the FET Q3 rises almost to the level of VDD, turning the FET Q3 on, such that an output signal VOUT from the output terminal 41 changes to a high level. Then, the level of this output signal VOUT falls to the Schottky potential (0.6 to 0.7 V) of the FET Q5 of the inverter 30. In the circuit described above, the voltage between the gate and source of the FET Q3 is as high as in a conventional circuit. However, the amount of drain current flowing toward the FET Q3 is limited to a degree by the current limiting element L1.

Figure 3:
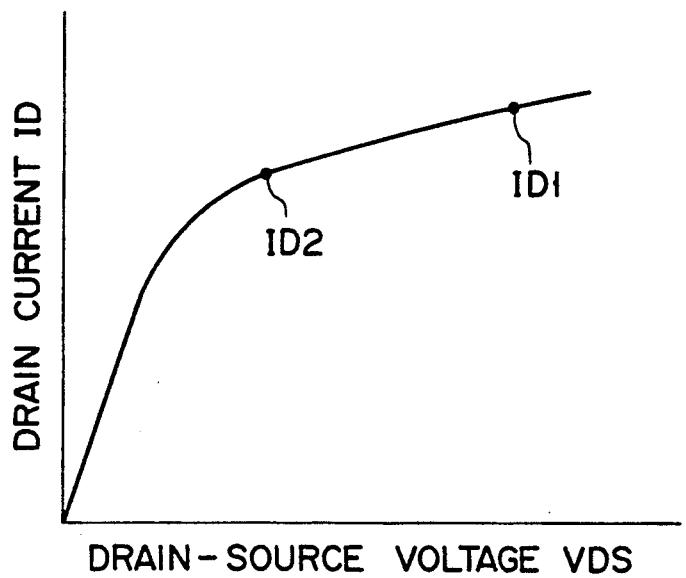
FIG. 3 is a graph showing the static characteristic of an FET used in the first embodiment.

As can be understood from the graph in FIG. 3, which shows the static characteristic of an FET, the amount of drain current ID2 in the circuit of the first embodiment which employs the current limiting element L1 is less than the amount of drain current ID1 in a conventional circuit which does not employ the current limiting element L1. Thus, according to the first embodiment, the amount of current flowing between the power source for applying the voltage VDD and the power source for applying the voltage VSS is reduced, ensuring low power consumption by the GaAs-MESFETs.

Thus, by providing the current limiting element L1 between the power source for application of the voltage VDD and the drain of the FET Q3, a DCFL circuit having a large capacity for driving a load circuit can be attained.

Figure 4:
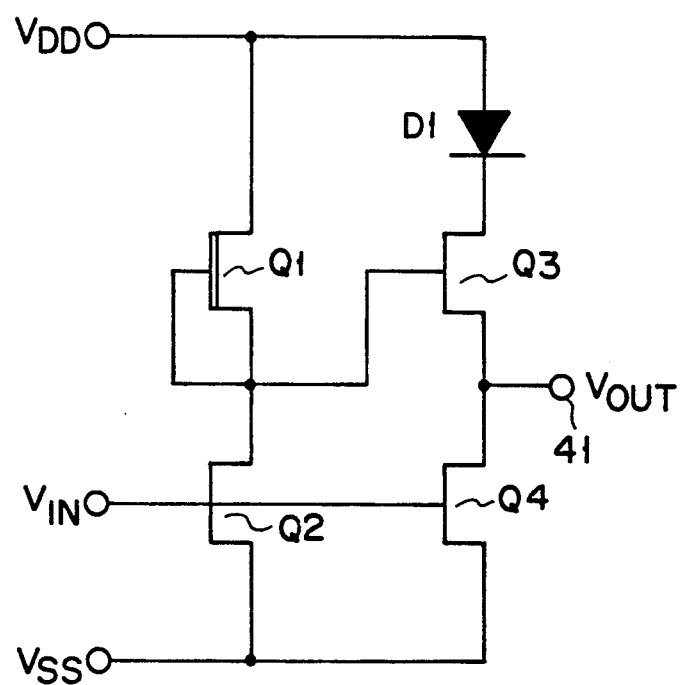
FIG. 4 is a diagram illustrating a circuit configuration wherein a diode is used as the current limiting element of the first embodiment.

FIG. 4 shows an example wherein a Schottky diode D1 is used as the current limiting element L1 employed in the circuit of the first embodiment.

It has been ascertained by simulation that the power consumption of the circuit shown in FIG. 4 is 25% less than that of a conventional circuit when the channel width and the threshold voltage of the FET Q1 are respectively 2.5 μm and −0.28V, the channel width and threshold voltage of the FET Q2 are respectively 5.0 μm and 0.15 V, the channel width and threshold voltage of each of the FETs Q3 and Q4 are respectively 13.5 μm and 0.15 V. As regards other conditions, the voltage VDD is 1.5 V, the voltage VSS is 0 V, the fan-out is equal to 5, and a 1 GHz sine wave is input as the input signal VIN.

FIG. 5 is a cross-sectional view of each of the FETs used in the first embodiment. In this drawing, reference numeral 61 represents an undoped GaAs substrate. Silicon is doped at high concentration into the surface region of the substrate 61 to form N+-wells 62 and 63 which serve respectively as a source and a drain. An N-well 64 is formed between the N+-wells 62 and 63 by doping silicon at low concentration. Source electrode 65 and drain electrode 66, which are made of ohmic metal, are arranged respectively on the N+-wells 62 and 63. Further, a gate electrode 67 made of gate metal is provided on the N-well 64.

FIG. 6 shows in cross section the structure of the Schottky diode used in the circuit shown in FIG. 4. In this drawing, reference numeral 61 is an undoped GaAs substrate, reference numeral 68 is an N+-well which is formed by doping silicon at high concentration and serves as a cathode of the Schottky diode, and reference numeral 69 is an active region which is formed to be adjacent to the N+-well 68 by doping silicon at low concentration and which serves as an anode of the Schottky diode. Moreover, a cathode electrode 70 made of ohmic metal and an anode electrode 71 made of gate metal are provided respectively on the N+-well 68 and the active region 69.

Figure 7:
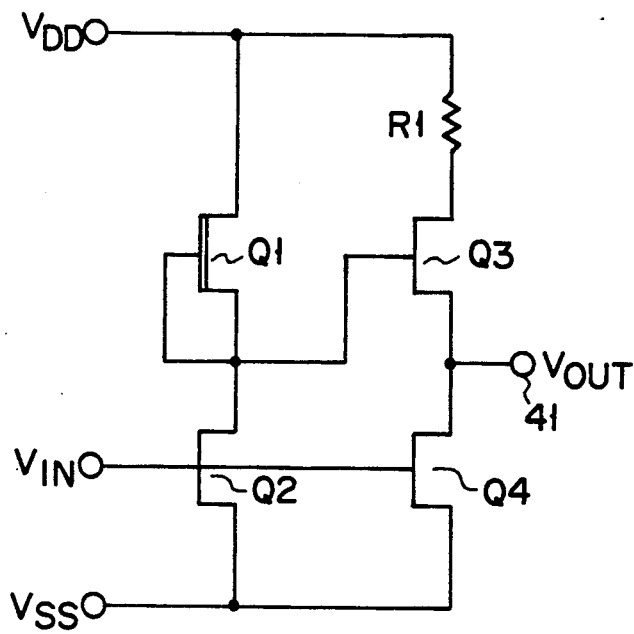
FIG. 7 is a diagram illustrating a circuit configuration wherein a resistor is used as the current limiting element of the first embodiment.

FIG. 7 shows an example wherein a resistor R1 is used as the current limiting element L1 employed in the circuit of the first embodiment. This example is accompanied by the same advantage as that in the case where the Schottky diode D1 is used as the current limiter L1.

FIG. 8 is a cross-sectional view of the resistor used in the circuit shown in FIG. 7. The structure shown in FIG. 8 is basically the same as that shown in FIG. 5, except that no gate electrode is provided on the N-well 64 in FIG. 8.

Figure 9:
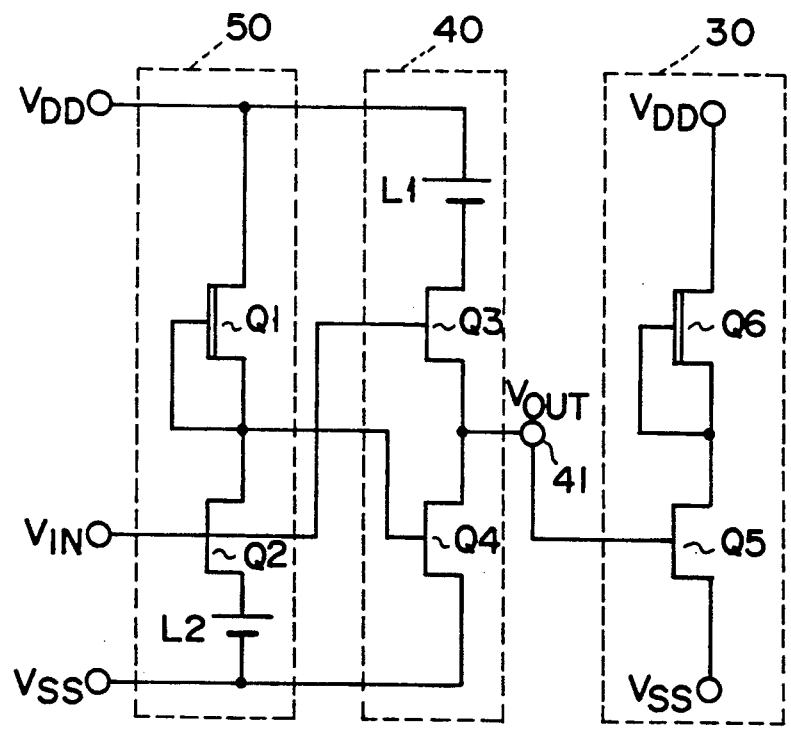
FIG. 9 is a diagram illustrating the configuration of an inverter circuit according to a second embodiment of the present invention.

FIG. 9 shows the inverter circuit according to the second embodiment of the present invention. This inverter circuit is provided on the output interface of an integrated circuit comprising a DCFL circuit, and includes an inverter 50 for inverting a signal generated in the integrated circuit and a push-pull buffer circuit 40 arranged on the output side of the inverter 50. Reference numeral 30 denotes an inverter which serves as the input section of another integrated circuit.

In the inverter 50, GaAs-MESFETs Q1 and Q2 and a voltage level shifting element L2 are provided as in a conventional circuit. Specifically, the FET Q1 is a depletion type FET having a negative threshold voltage. The drain of the FET Q1 is connected to a power source for applying a voltage VDD of e.g. +1.5 V, and the source and gate of the FET Q1 are connected to each other. On the other hand, the FET Q2 is an enhancement type FET having a positive threshold voltage. The drain of the FET Q2 is connected to the node at which the source and gate of the FET Q1 are connected to each other. An input signal VIN is supplied to the gate of the FET Q2. Further, one end of the voltage level shifting element L2 is connected to the power source for applying the voltage VSS, and the other end thereof is connected to the source of the FET Q2.

GaAs-MESFETS Q3 and Q4 are provided in the buffer circuit 40. The FET Q3 is also of an enhancement type. The source of the FET Q3 is connected to an output terminal 41, and the input signal VIN is supplied to the gate of the FET Q3. The FET Q4 is also of an enhancement type, and its drain, source, and gate are connected respectively to the output terminal 41, the power source for applying the voltage VSS, and the node at which the source and gate of the FET Q1 of the inverter 50 are connected to each other. Moreover, one end of the current limiting element L1 is connected to the power source for applying the voltage VDD, and the other end thereof is connected to the drain of the FET Q3. The channel width of each of the FETs in the inverter 50 is set to be less than that of each of the FETs in the buffer circuit 40.

In the inverter 30, GaAs-MESFETs Q5 and Q6 are provided as in a conventional circuit. The FET Q5 is of an enhancement type, while the FET Q6 is of a depletion type.

In the second embodiment, the current limiting element L1 is arranged between the power source for applying the voltage VDD and the drain of the FET Q3. In addition, the buffer circuit 40 has an inverting function.

The operation of the inverter circuit having the structures described above will now be explained. When the input signal VIN changes to a high level, the FETs Q2 and Q3 are turned on. When the FET Q2 is thus placed in an ON state, the gate potential of the FET Q4 drops to almost VSS, turning the FET Q4 off, such that an output signal VOUT from the output terminal 41 changes to a high level. Then, the level of this output signal VOUT falls to the Schottky potential (0.6 to 0.7 V) of the FET Q5. In the inverter circuit described above, the voltage between the gate and source of the FET Q3 is high enough to produce a large amount of drain current. However, by virtue of the current limiting element L1, the amount of drain current is limited. Thus, according to the second embodiment, low power consumption of the GaAs-MESFETs is attained as in the first embodiment shown in FIG. 2.

In addition, the circuit of the second embodiment is designed such that the input signal VIN is input to the gate of the FET Q3. A circuit thus designed entails the possibility that the FET Q3 cannot be fully turned on, depending upon the magnitude of the input signal VIN. According to the second embodiment, to eliminate this possibility, the voltage level shifting element L2 is connected between the source of the FET Q2 and the power source for applying the voltage VSS. This level shifting element L2 raises the source potential of the FET Q2 by a predetermined value such that the FET Q3 is fully turned on.

FIG. 10 shows an example wherein the Schottky diodes D1 and D2 are used respectively as the current limiting element L1 and the voltage level shifting element L2 which are employed in the second embodiment.

FIG. 11 shows an example wherein the resistor R1 and the Schottky diodes D2 are used respectively as the current limiting element L1 and the voltage level shifting element L2 which are employed in the second embodiment.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A field effect transistor circuit comprising:
    a first potential source;
    a second potential source;
    an output terminal for outputting a signal;
    a first GaAs field effect transistor of a depletion type which has a drain, a source, and a drain, said drain being connected to said first potential source, and said source and said gate being connected to each other;
    a second GaAs field effect transistor of an enhancement type which has a drain, a source, and a gate, the drain of said second GaAs field effect transistor being connected to a node where the source and gate of said first GaAs field effect transistor are connected to each other, and the gate of said second GaAs field effect transistor receiving said input signal;
    a voltage level shifting element having two ends, one of which is connected to said second power source and the other of which is connected to the source of said second GaAs field effect transistor;
    a current limiting element having two ends, one of which is connected to said first potential source;
    a third GaAs field effect transistor of an enhancement type which has a drain, a source, and a gate, the drain and source of said third GaAs field effect transistor being connected respectively to the other end of said current limiting element and said output terminal, and the gate of said third GaAs field effect transistor receiving said input signal; and
    a fourth GaAs field effect transistor of an enhancement type which has a drain, a source, and a gate, the drain and source of said fourth GaAs field effect transistor being respectively connected to said output terminal and said second potential source, and the gate of said fourth GaAs field effect transistor receiving a signal obtained at the node where the gate and source of said first GaAs transistor are connected to each other.

2. A field effect transistor circuit according to claim 1, wherein said current limiting circuit is a diode.

3. A field effect transistor circuit according to claim 1, wherein said current limiting circuit is a resistor.

4. A field effect transistor circuit according to claim 1, wherein said voltage level shifting element is a diode.

5. A field effect transistor circuit according to claim 1, wherein a gate width of said fourth GaAs field effect transistor is set to be less than that of said second GaAs field effect transistor.

6. A field effect transistor circuit comprising:
   a signal inverting circuit to which an input signal is supplied;
   a first potential source;
   a second potential source;
   an output terminal for outputting a signal;
   a diode having an anode and a cathode, wherein the anode is connected to the first potential source;
   a first GaAs field effect transistor having a drain, a source, and a gate, the drain being connected to the cathode of the diode, the source being connected to the output terminal, and the gate receiving one of the input signal and an output signal of the signal inverting circuit; and
   a second GaAs field effect transistor having a drain, a source, and a gate, the drain and source of said second GaAs field effect transistor being respectively connected to the output terminal and the second potential source, and the gate of the second GaAs field effect transistor receiving the other of the input signal and the output signal of the signal inverting circuit.

7. A field effect transistor circuit according to claim 6, wherein each of the first and second effect transistors is an enhancement type transistor.

8. A field effect transistor circuit according to claim 6, wherein the signal inverting circuit includes:
   a third GaAs field effect transistor having a drain, a source, and a gate, the source being connected to the second potential source, and the gate receiving the input signal; and
   a fourth GaAs field effect transistor having a drain, a source, and a gate, the drain of the fourth GaAs field effect transistor being connected to the first potential source, and the source and gate of the fourth GaAs field effect transistor being connected to the drain of the third GaAs field effect transistor.

9. A field effect transistor circuit according to claim 8, wherein the third GaAs field effect transistor is an enhancement type transistor, and the fourth GaAs field effect transistor is a depletion type transistor.

10. A field effect transistor circuit according to claim 8, wherein a channel width of the fourth GaAs field effect transistor is set to be less than a channel width of the second GaAs field effect transistor.

11. A field effect transistor circuit comprising:
   a first potential source;
   a second potential source;
   an output terminal for outputting a signal;
   a first GaAs field effect transistor of a depletion type having a drain, a source, and a gate, the drain being connected to the first potential source, and the source and the gate being connected to each other at a node;
   a second GaAs field effect transistor of an enhancement type having a drain, a source, and a gate, the drain of the second GaAs field effect transistor being connected to the node connecting the source and the gate of the first GaAs field effect transistor, the source of the second GaAs field effect transistor being connected to the second potential source, and the gate of the second GaAs field effect transistor receiving the input signal;
   a diode having an anode and a cathode, wherein the anode is connected to the first potential source;
   a third GaAs field effect transistor of an enhancement type having a drain, a source, and a gate, the drain and the source of the third GaAs field effect transistor being respectively connected to the cathode of the diode and the output terminal, and the gate of the third GaAs field effect transistor receiving a signal obtained at the node connecting the source and the gate of the first GaAs field effect transistor; and
   a fourth GaAs field effect transistor of an enhancement type having a drain, a source, and a gate, the drain and the source of the fourth GaAs field effect transistor being connected respectively to the output terminal and the second potential source, and the gate of the fourth GaAs field effect transistor receiving the input signal.

* * * * *